(12) United States Patent
Jung et al.

(10) Patent No.: US 10,947,126 B2
(45) Date of Patent: Mar. 16, 2021

(54) DIELECTRIC, CAPACITOR AND SEMICONDUCTOR DEVICE INCLUDING THE SAME, AND METHOD OF PREPARING THE DIELECTRIC

(71) Applicant: Samsung Electronics Co., Ltd., Suwon-si (KR)

(72) Inventors: Doh Won Jung, Seoul (KR); Chan Kwak, Yongin-si (KR); Euncheol Do, Seoul (KR); Hyeon Cheol Park, Hwaseong-si (KR); Daejin Yang, Yeongju-si (KR); Taewon Jeong, Yongin-si (KR); Giyoung Jo, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/409,096

(22) Filed: May 10, 2019

(65) Prior Publication Data
US 2020/0165142 A1 May 28, 2020

(30) Foreign Application Priority Data
Nov. 26, 2018 (KR) .................. 10-2018-0147696

(51) Int. Cl.
*H01G 4/10* (2006.01)
*C01G 35/00* (2006.01)
*H01L 49/02* (2006.01)

(52) U.S. Cl.
CPC .............. *C01G 35/00* (2013.01); *H01G 4/10* (2013.01); *H01L 28/55* (2013.01);
(Continued)

(58) Field of Classification Search
CPC .......... C01G 35/00; H01G 4/10; H01L 28/55; C01P 2004/03; C01P 2004/61;
(Continued)

(56) References Cited

U.S. PATENT DOCUMENTS 4,244,722 A 1/1981 Tsuya et al.
7,132,373 B2 * 11/2006 Fukuhisa .......... H01L 21/02186
438/778
(Continued)

FOREIGN PATENT DOCUMENTS

JP 2018115093 A 7/2018

OTHER PUBLICATIONS

Kanghoon Yim et al., "Novel high-k dielectrics for next-generation electronic devices screened by automated ab initio calculations" NPG Asia Materials (2015) 7.
(Continued)

*Primary Examiner* — Noah S Wiese
(74) *Attorney, Agent, or Firm* — Harness, Dickey & Pierce, P.L.C.

(57) ABSTRACT

Provided are a dielectric, a capacitor and a semiconductor device that include the dielectric, and a method of preparing the dielectric, the dielectric including: a composition represented by Formula 1; and an oxide including a perovskite type crystal structure having a polar space group or a non-polar space group other than a Pbnm space group:

$A_xB_yO_{3-\delta}$  <Formula 1> wherein, in Formula 1,
A is a monovalent, divalent, or trivalent cation,
B is a trivalent, tetravalent, or pentavalent cation, and
$0.5 \leq x \leq 1.5$, $0.5 \leq y \leq 1.5$, and $0 \leq \delta \leq 0.5$.

19 Claims, 11 Drawing Sheets

(52) U.S. Cl.
CPC ...... *C01P 2002/34* (2013.01); *C01P 2002/72* (2013.01); *C01P 2002/76* (2013.01); *C01P 2004/03* (2013.01); *C01P 2004/61* (2013.01); *C01P 2006/40* (2013.01)

(58) Field of Classification Search
CPC .............. C01P 2006/40; C01P 2002/76; C01P 2002/72; C01P 2002/34
See application file for complete search history.

(56) References Cited

U.S. PATENT DOCUMENTS

| | | |
|---|---|---|
| 10,032,892 B2 | 7/2018 | Ohta et al. |
| 2005/0136292 A1* | 6/2005 | Mariani ............ H01L 21/02183 428/702 |
| 2007/0254154 A1* | 11/2007 | Wong .................... C01B 13/322 428/402 |
| 2010/0129286 A1* | 5/2010 | Wong .................... C01G 25/00 423/594.12 |
| 2013/0003254 A1* | 1/2013 | Koutsaroff ............. H01G 4/085 361/281 |
| 2016/0027579 A1* | 1/2016 | Kurachi .................. H01G 4/12 361/321.1 |

OTHER PUBLICATIONS

Vishnu Shanker et al., "Nanocrystalline $NaNbO_3$ and $NaTaO_3$: Rietveld studies, Raman spectroscopy and dielectric properties" Solid State Sciences 11 (2009) 562-569.

M. Ahtee and L. Unonius, "The Structure of $NaTaO_3$ by X-ray Powder Diffraction" Acta. Cryst. (1977) A33, 150-154.

* cited by examiner

DIELECTRIC, CAPACITOR AND SEMICONDUCTOR DEVICE INCLUDING THE SAME, AND METHOD OF PREPARING THE DIELECTRIC

CROSS-REFERENCE TO RELATED APPLICATION

This application claims the benefit of Korean Patent Application No. 10-2018-0147696, filed on Nov. 26, 2018, in the Korean Intellectual Property Office, the disclosure of which is incorporated herein in its entirety by reference.

BACKGROUND

1. Field

The present disclosure relates to a dielectric, a capacitor and a semiconductor device that include the dielectric, and a method of preparing the dielectric.

2. Description of the Related Art

Semiconductor devices such as memories and transistors are used in various household appliances and industrial devices. According to high performance of household appliances and industrial devices, semiconductor devices are high-integrated and refined.

According to high integration and refinement of semiconductor devices, the size of semiconductor devices decreases. For example, as the size of a capacitor decreases, the capacity of the capacitor decreases while leakage current increases. To solve such problems, various methods are proposed. For example, by increasing an electrode area of the capacitor or decreasing a thickness of a dielectric, a structure of the capacitor may be modified, or by improving a manufacturing process of the capacitor, the leakage current may be suppressed while the capacity of the capacitor is maintained.

However, there is a limitation in maintaining the capacity of the capacitor and suppressing current leakage by the structural improvements, such as increasing the electrode area of the capacitor or decreasing the thickness of the dielectric, or the improvements in the manufacturing process capacitor.

The capacity of the capacitor including the dielectric may be presented by Equation 1:

$$C = \varepsilon_r \varepsilon_0 \frac{A}{d}.$$ <Equation 1>

In Equation 1, $\varepsilon_r$ indicates a permittivity of vacuum, $\varepsilon_0$ is a dielectric constant, A indicates an area of the capacitor, and d indicates a thickness of the dielectric.

The capacity of the capacitor is proportional to the area of the electrode and the dielectric constant of the dielectric, and is inversely proportional to the thickness of the dielectric. Beside the area of the electrode in the capacitor and the thickness of the dielectric, the capacity of the capacitor may be increased by increasing the dielectric constant of the dielectric. For example, the dielectric constant of the dielectric, such as $HfO_2$, $ZrO_2$, or the like, may be from 25 to 40. In addition, by lowering dielectric loss of the dielectric, the leakage current of the capacitor may be reduced.

SUMMARY

Provided is a dielectric including an oxide having a new crystal structure, the dielectric having an improved dielectric constant and/or a low dielectric loss.

Provided is a capacitor including the dielectric.

Provided is a semiconductor device including the dielectric.

Provided is a method of preparing the dielectric.

Additional aspects will be set forth in part in the description which follows and, in part, will be apparent from the description, or may be learned by practice of the presented embodiments.

According to an aspect of the present disclosure, a dielectric includes an oxide having a composition represented by Formula 1 and having a perovskite type crystal structure belonging to a polar space group or a non-polar space group other than a Pbnm space group:

$A_xB_yO_{3-\delta}$ <Formula 1>

In Formula 1,
A may be a monovalent, divalent, or trivalent cation,
B may be a trivalent, tetravalent, or pentavalent cation, and
$0.5 \le x \le 1.5$, $0.5 \le y \le 1.5$, and $0 \le \delta \le 0.5$.

According to another aspect of the present disclosure, a capacitor includes a first electrode, a second electrode, and the dielectric disposed between the first electrode and the second electrode.

According to another aspect of an embodiment, a semiconductor device includes the dielectric.

According to another aspect of the present disclosure, a method of preparing the dielectric includes mixing an alkali metal or an alkaline earth metal with a transition metal precursor to prepare a mixture, performing a first thermal process on the mixture in an air atmosphere at a temperature in a range of 1,000° C. to 1,400° C. for 1 hour to 20 hours to prepare a first sintered material, molding and pressurizing the first sintered material to prepare a molded article; and performing a second thermal process on the molded article at a temperature of 1,400° C. or higher for 1 hour to 20 hours to prepare a second sintered material.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
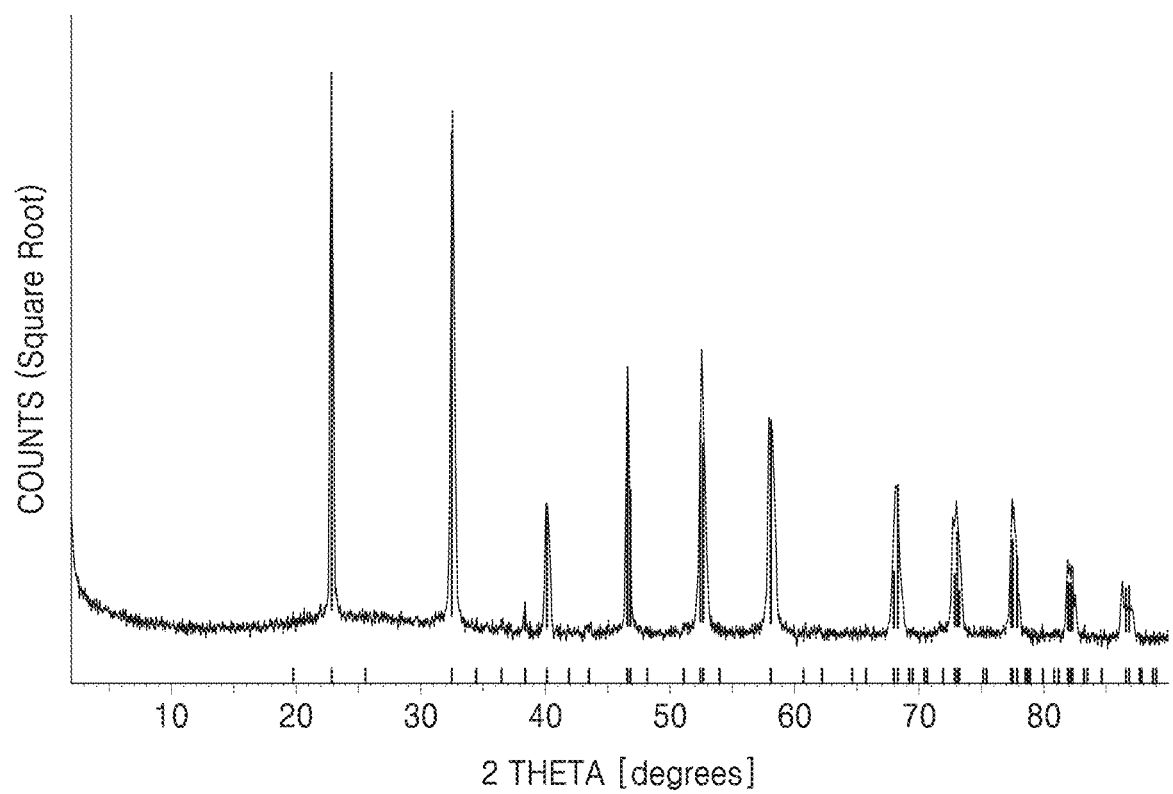
FIG. 1A shows an X-ray diffraction (XRD) spectrum of a dielectric prepared by performing a first thermal process thereon according to Example 1.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. Expressions such as "at least one of," when preceding a list of elements, modify the entire list of elements and do not modify the individual elements of the list.

As the present inventive concepts described below allow for various changes and numerous embodiments, example embodiments will be illustrated in the drawings and described in detail in the written description. However, this is not intended to limit embodiments to particular modes of practice, and it is to be appreciated that all changes, equivalents, and substitutes that do not depart from the spirit and technical scope of the inventive concepts are encompassed in embodiments.

The terms used in the present specification are merely used to describe example embodiments, and are not intended to limit embodiments. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. "/" as used herein may be interpreted as "and" or "or" depending on the situation.

In the drawings, the size or thickness of each layer, region, or element are arbitrarily exaggerated or reduced for better understanding or ease of description, and thus the present inventive concepts are not limited thereto. Throughout the written description and drawings, like reference numbers and labels will be used to denote like or similar elements. It will also be understood that when an element such as a layer, a film, a region or a component is referred to as being "on" another layer or element, it can be "directly on" the other layer or element, or intervening layers, regions, or components may also be present. Although the terms "first", "second", etc., may be used herein to describe various elements, components, regions, and/or layers, these elements, components, regions, and/or layers should not be limited by these terms. These terms are used only to distinguish one component from another, not for purposes of limitation. In the specification, "polar space group" means space group does not contain symmetry operators, e.g., symmetry center, that fix the origin of the unit cell in one or more directions, but contains a polar axis, an axis showing different properties at the two ends. In the specification, "non-polar space group" means space group contains symmetry operators, e.g., symmetry center, that fix the origin of the unit cell in one or more directions, and does not contain a polar axis.

Hereinafter, a dielectric according to an embodiment, a capacitor and a semiconductor device that include the dielectric, and a method of preparing the dielectric will be described in detail.

According to an embodiment of the present disclosure, a dielectric has an oxide having a composition represented by Formula 1 and having a perovskite type crystal structure which belongs to a polar space group or a non-polar space group other than a Pbnm space group:

$A_xB_yO_{3-\delta}$. <Formula 1>

In Formula 1, A may be a monovalent, divalent, or trivalent cation, B may be a trivalent, tetravalent, or pentavalent cation, and $0.5 \le x \le 1.5$, $0.5 \le y \le 1.5$, and $0 \le \delta \le 0.5$. $\delta$ in Formula 1 indicates an oxygen vacancy that renders the oxide of Formula 1 electrically neutral.

Regarding the oxide included in the dielectric, the perovskite type crystal structure belonging to the polar space group or the non-polar space group other than the Pbnm space group provides improved dielectric characteristics. When the dielectric constant is measured at 1 MHz, the oxide included in the dielectric may have a high dielectric constant in a range of about 1 to about 50, and for example, about 55 or higher, about 60 or higher, about 65 or higher, about 70 or higher, about 75 or higher, about 80 or higher, about 85 or higher, about 90 or higher, about 95 or higher, about 100 or higher, about 105 or higher, about 110 or higher, about 115 or higher, about 120 or higher, about 125 or higher, about 130 or higher, about 135 or higher, or about 140 or higher. When the oxide included in the dielectric has such a high electric constant, the capacitor including the dielectric may have an improved capacity.

In the oxide included in the dielectric, the polar space group may include a Pc2$_1$n space group, and the non-polar space group may include a Pcmn space group, a P4/mbm group, a Pm-3m group, or a Cmcm space group. When the oxide included in the dielectric belongs to such a space group, a dielectric constant thereof is improved.

The oxide included in the dielectric may have, for example, a composition represented by Formula 2:

$A_xB_yO_3$. <Formula 2>

In Formula 2, A may be a monovalent cation, B may be a pentavalent cation, and $0.9 \le x \le 1.5$ and $0.9 \le y \le 1.5$.

In the oxide represented by Formula 1 or 2, A may be, for example, at least one selected from an alkali metal element and an alkaline earth metal element. For example, A may at least one selected from lithium (Li), sodium (Na), potassium (K), rubidium (Rb), and cesium (Cs).

In the oxide represented by Formula 1 or 2, B may be, for example, a transition metal element. For example, B may be at least one selected from vanadium (V), niobium (Nb), and tantalum (Ta).

In the oxide represented by Formula 1 or 2, A may be, for example, at least one selected from Li, Na, K, Rb, and Cs, and B may be, for example, at least one selected from V Nb, and Ta.

The oxide represented by Formula 1 or 2 may be, for example, at least one selected from $Na_{1-x}K_xTaO_3$ ($0 \le x \le 1$), $Na_{1-x}Li_xTaO_3$ ($0 \le x \le 1$), $Na_{1-x}K_xTaO_3$ ($0 \le x \le 1$), $Na_{1-x}Rb_xTaO_3$ ($0 \le x \le 1$), $Na_{1-x}Cs_xTaO_3$ ($0 \le x \le 1$), $Na_{1-x}K_xVO_3$ ($0 \le x \le 1$), $Na_{1-x}Li_xVO_3$ ($0 \le x \le 1$), $Na_{1-x}K_xVO_3$ ($0 \le x \le 1$), $Na_{1-x}Rb_xVO_3$ ($0 \le x \le 1$), $Na_{1-x}Cs_xVO_3$ ($0 \le x \le 1$), $Na_{1-x}K_xNbO_3$ ($0 \le x \le 1$), $Na_{1-x}Li_xNbO_3$ ($0 \le x \le 1$), $Na_{1-x}K_xNbO_3$ ($0 \le x \le 1$), $Na_{1-x}Rb_xNbO_3$ ($0 \le x \le 1$), $Na_{1-x}Cs_xNbO_3$ ($0 \le x \le 1$), $K_{1-x}Li_xTaO_3$ ($0 \le x \le 1$), $K_{1-x}Rb_xTaO_3$ ($0 \le x \le 1$), $K_{1-x}Cs_xTaO_3$ ($0 \le x \le 1$), $K_{1-x}Li_xVO_3$ ($0 \le x \le 1$), $K_{1-x}Rb_xVO_3$ ($0 \le x \le 1$), $Na_{1-x}Cs_xVO_3$ (0≤x≤1), $K_{1-x}Li_xNbO_3$ (0≤x≤1), $K_{1-x}Rb_xNbO_3$ (0≤x≤1), and $K_{1-x}Cs_xNbO_3$ (0≤x≤1). In particular, the oxide represented by Formula 1 or 2 may include at least one selected from $NaTaO_3$, $LiTaO_3$, $KTaO_3$, $RbTaO_3$, $CsTaO_3$, $NaVO_3$, and $NaNbO_3$.

The oxide included in the dielectric may be, for example, an agglomerate of primary particles. Referring to FIGS. 2A to 2D, the dielectric may be an agglomerate of a plurality of primary particles, e.g., crystallites. The agglomerate may include a plurality of primary particles and grain boundaries disposed between the plurality of the primary particles. The oxide included in the dielectric may be, for example, a pressurized sintered material. The primary particles may each have a single perovskite type crystal structure belonging to a $Pc2_1n$ space group. The primary particles may be single crystals or polycrystallines.

In the oxide included in the dielectric, the primary particles may have an average particle diameter in a range of about 0.1 um to about 20 um, about 0.5 um to about 20 um, about 1 um to about 20 um, about 1 um to about 10 um, about 2 um to about 9 um, about 3 um to about 8 um, about 4 um to about 8 um, or about 4 um to about 7 um. When the average particle diameter of the primary particles is too small, abnormal grain growth may occur due to over-sintering. When the average particle diameter is too large, the dielectric including the oxide may be difficult to be applied to a high density device. The average particle diameter of the primary particles may be, for example, obtained by calculating an arithmetic mean after measuring each of the primary particles shown in a scanning microscope (SEM) image. However, embodiments of the present disclosure are not limited thereto, and any method used in the art to determine the average particle diameter of the primary particles may be used. As the diameter of the primary particles, a diameter of spherical primary particles may be, for example, a particle diameter of the primary particles, and a diameter of non-spherical primary particles may be, for example, a maximum value of a distance between both ends of the primary particles.

In one embodiment, the oxide included in the dielectric may be porous. Referring to FIGS. 2A to 2D, the oxide may be, for example, in an agglomerate form of the primary particles, wherein the primary particles include pores therebetween.

In one or more embodiment, the oxide included in the dielectric may be substantially non-porous. For example, by preparing the oxide included in the dielectric in such a manner that pores are not substantially formed, a dielectric containing no pores may be obtained. When the dielectric is non-porous, a dielectric constant of the dielectric may be further increased. Substantially non-porosity means that no pores larger than the thickness of the grain boundaries between the primary particles are substantially observed in a scanning electron microscope (SEM) image of the cross-section of the dielectric.

The oxide included in the oxide decided in the dielectric may have a relative density of 60% or more, 65% or more, 70% or more, 75% or more, 80% or more, 85% or more, 90% or more, or 95% or more, when measured according to a buoyancy method (that is, Archimedes method). When the oxide decided in the dielectric has such a high relative density, the dielectric constant of the oxide may be also increased. The relative density is a percentage value of a density of an oxide measured with respect to a density of liquid used in the buoyancy method.

The oxide decided in the dielectric may have a dielectric loss, e.g., tan δ, of 0.11 or less, 0.105 or less, 0.10 or less, 0.095 or less, 0.090 or less, 0.085 or less, 0.080 or less, 0.075 or less, 0.070 or less, 0.065 or less, 0.060 or less, 0.055 or less, 0.050 or less, 0.045 or less, 0.040 or less, 0.035 or less, 0.030 or less, 0.025 or less, 0.020 or less, 0.015 or less, or 0.010 or less. When the oxide decided in the dielectric has such a low dielectric loss, leakage current of the capacitor may be reduced and a short circuit may be reduced or prevented.

The oxide decided in the dielectric may have a band gap of 3 eV or higher. For example, the oxide decided in the dielectric may have a band gap in a range of 3 eV to 4 eV. When the oxide has a low band gap, the dielectric may have reduced specific resistance, thereby having reduced resistance of the capacitor. When the oxide has a high band gap, the dielectric is difficult to match with an electrode connected thereto.

According to another aspect of the present disclosure, a capacitor includes a first electrode, a second electrode, and/or the dielectric disposed between the first electrode and the second electrode.

When the capacitor includes the dielectric, the capacity of the capacitor increases while the leakage current of the capacity decreases. Here, types of the capacitor are not particularly limited. The capacitor may be, for example, a capacitor diode included in a memory cell, or a stacked capacitor used in a stacked ceramic condenser.

Figure 4A:
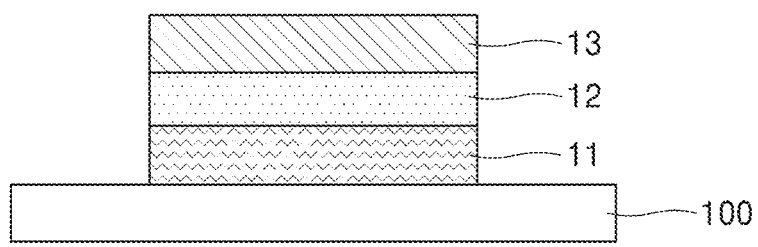
FIGS. 4A to 4D are each a schematic diagram of a capacitor according to an embodiment.

FIG. 4A shows an example structure of the capacitor including the dielectric. Here, the capacitor includes an insulating substrate 100, a first electrode 11 and a second electrode 13 in pairs, and a dielectric layer 12. Each of the first electrode 11 and the second electrode 13 may serve as a lower electrode and an upper electrode. The first electrode 11 and the second electrode 13 may not be in electrical contact with one another, and the dielectric layer 12 including the dielectric may be disposed between the first electrode 11 and the second electrode 13.

Figure 4B:
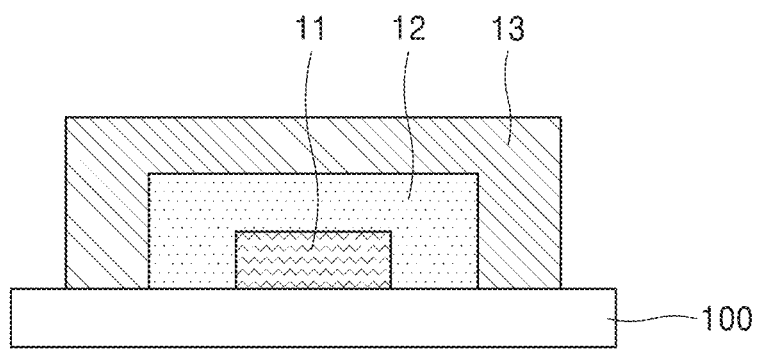
Figure 4C:
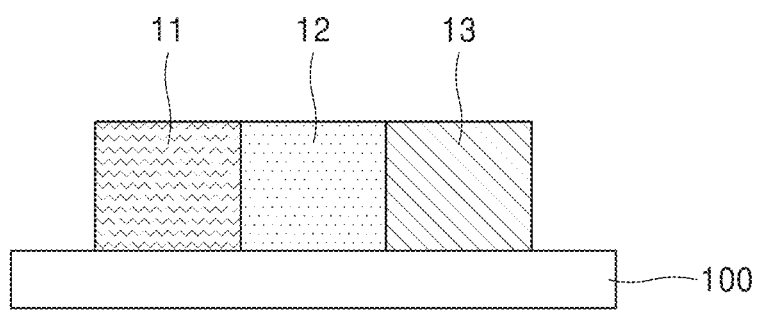
Figure 4D:
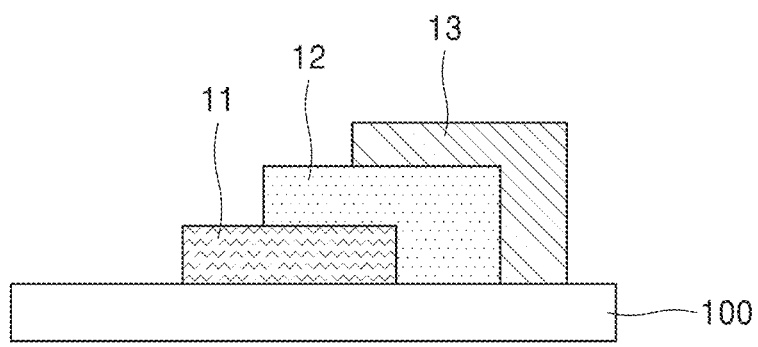

FIGS. 4B to 4D each show an example structure of the capacitor including the dielectric. In FIG. 4B, the dielectric layer 12 may be disposed on the insulating substrate 100 to coat and/or at least partially cover or contact the first electrode 11, and the second electrode 13 may be also disposed on the insulating substrate 100 to coat and/or at least partially cover or contact the dielectric layer 12. In FIG. 4C, the first electrode 11 and the second electrode 13 may be disposed on the insulating substrate 100, and the dielectric layer 12 may be disposed between the first electrode 11 and the second electrode 13. In FIG. 4D, the dielectric layer 12 may be disposed on the insulating substrate 100 to partially coat and/or at least partially cover or contact the first electrode 11, and the second electrode 13 may be also disposed on the insulating substrate 100 to coat and/or at least partially cover or contact other parts of the dielectric layer 12. The dielectric layer 12 which includes the dielectric may exhibit the dielectric characteristics. The dielectric characteristics may be maintained even when the polarization generated by the application of the electric field is 0, and may be also characterized by that the direction of polarization is reversed (e.g., polarization inversion) by the application of the electric field.

In one embodiment, the dielectric layer 12 may be formed by using, for example, a chemical vapor deposition process, an organometallic chemical vapor deposition process, a liquid phase epitaxy process, a sol-gel process, a sputtering deposition process, a pulsed laser deposition process, an atomic layer deposition process, or the like.

When the dielectric layer 12 is formed by using an organometallic chemical vapor deposition process, the insulating substrate 100 on which the surface-treated first electrode 11 is formed may be loaded into a reaction chamber, wherein the reaction chamber is maintained in conditions with a temperature in a range of about 500° C. to about 600° C. and a pressure in a range of about 1 torr to about 10 torr. Subsequently, an organometallic precursor may be introduced into the surface-treated first electrode 11, and an oxidizing agent may be supplied thereto to form the dielectric layer 12 on the surface-treated first electrode 11. When the dielectric layer 12 includes $NaTaO_3$, the organometallic precursor may include sodium, a first precursor compound including sodium, tantalum or a second precursor compound including tantalum, and the oxidizing agent may include oxygen ($O_2$), ozone $O_3$), nitrogen dioxide ($NO_2$), or nitrous oxide ($N_2O$).

The dielectric layer 12 may be subjected to a thermal process to further crystallize materials constituting the dielectric layer 12. For example, the dielectric layer 12 may be subjected to rapid thermal process (RTP) in oxygen gas ($O_2$), nitrogen gas ($N_2$), argon gas (Ar), ammonia gas ($NH_4$), or a mixed gas atmosphere. The RTP may be performed, for example, at a temperature in a range of about 500° C. to about 650° C. for about 30 minutes to about 3 minutes.

In one or more embodiments, the dielectric layer 12 may be formed by performing a thermal process on a coating film which is obtained by coating and drying a dielectric paste including the dielectric.

Here, a coating process does not involve a vacuum process or a high-temperature process, and in this regard, the dielectric layer 12 may be prepared in a simple manner.

The dielectric paste may include the dielectric, an organic substance, and/or a solvent. The dielectric paste may include dielectric particles. The organic substance may be embedded in pores between the dielectric particles so that the short circuit of the capacitor may be reduced or prevented while the yield of the capacitor may be increased.

The organic substance may include, for example, a monomer, an oligomer, a polymer, a photopolymerization initiator, a plasticizer, a labeling agent, a surfactant, a silane coupling agent, an antifoaming agent, a pigment, a dispersant, or the like. In terms of the improvement of bending resistance of the capacitor, the organic substance may be, for example, an oligomer or a polymer. Such an oligomer or a polymer may be, for example, a thermoplastic resin, a thermosetting resin, or the like. For example, the oligomer or the polymer may be an acryl resin, an epoxy resin, a novolac resin, a phenol resin, a polyimide precursor resin, a polyimide resin, a polysiloxane resin, a fluorine-based resin, a polyvinyl acetal resin, or the like.

For use as the solvent, any material capable of dispersing the dielectric particles and dissolving the organic substance may be used. For example, the solvent may be, for example, a ketone-based solvent, such as methyl ethyl ketone, acetone, diethyl ketone, methyl iso-butyl ketone, methyl iso-propyl ketone, cyclopentanone, cyclohexanone, or the like; an alcohol-based solvent, such as methanol, ethanol, isopropanol, isobutyl alcohol, benzyl alcohol, methoxymethyl butanol, ethylene glycol, diethylene glycol, glycerin, or the like; an ether-based solvent, such as diethyl ether, diisopropyl ether, 1,2-dimethoxyethane, 1,4-dioxane, tetrahydrofuran, tetrahydropyran, anisole, diethylene glycol dimethyl ether (Diglyme), diethylene glycol ethyl ether (Carbitol), or the like; a cellosolve-based solvent, such as methyl cellosolve, ethyl cellosolve, phenyl cellosolve, or the like; an aliphatic hydrocarbon-based solvent, such as hexane, pentane, heptane, cyclohexane, or the like; an aromatic hydrocarbon-based solvent, such as toluene, xylene, and benzene, or the like; an aromatic heterocyclic compound-based solvent, such as pyridine, pyrazine, furan, pyrrole, thiophene, N-methylpyrrolidone, or the like; an amide-based solvent, such as N,N-dimethylformamide, N,N-dimethylacetamide, or the like; a halogen compound-based solvent, such as trichloro ethylene, dichloromethane, chloroform, 1,2-dichloroethane, chlorobenzene, or the like; an ester-based solvent, such as ethyl acetate, methyl acetate, ethyl formate, ethyl lactate, dimethyl carbonate, diethyl carbonate, propylene carbonate, γ-butyrolactone, or the like; a sulfur compound-based solvent, such as dimethyl sulfoxide, sulfolane, or the like; a nitrile-based solvent, such as acetonitrile, propionitrile, acrylonitrile, or the like; and various organic solvents including an organic acid-based solvent, such as formic acid, acetic acid, trichloroacetic acid, trifluoroacetic acid, or the like, or a mixed solvent of the foregoing solvents.

The coating method may include, for example, a spin coating method, a blade coating method, a slot-die coating method, a screen printing method, a bar coater method, a molding method, a Gravure printing method, a flexographic printing method, an off-set printing method, a dip-coating method, an inkjet method, a dispenser method, or the like. Among these coating methods, in terms of pattern processability and unveiling properties, a coating method, such as a screen printing method, a Gravure printing method, a Gravure printing method, a flexographic printing method, an off-set printing method, an inkjet method, and a dispenser method, or the like may be used.

A method of removing the solvent from the coating film may be, for example, a heat drying method or a vacuum drying method using an even, a hot plate, infrared rays, or the like, at a temperature, for example, in a range of about 50° C. to about 140° C. for 1 minute to about several hours.

Next, to improve the dielectric characteristics, the coating film may be cured. Here, a temperature at which the curing is performed may be selected from depending on a type of a dielectric compound, a solvent to be used, and a type of a substrate. For example, when the organic substance included in the dielectric paste is an acryl resin, the temperature at which the curing is performed may be in a range of about 50° C. to about 300° C. in terms of heat-resisting properties. In addition, when the insulating substrate 100 is polyethylene terephthalate, the temperature at which the curing is performed may be in a range of about 50° C. to about 150° C. in consideration of reducing or preventing the processing accuracy associated with thermal expansion of the insulating substrate 100. A curing method may include a heat curing method using an oven, an inert oven, a hot plate, infrared rays, a vacuum curing method, a curing method using a xenon lamp, a photocuring method using UV light, or the like.

To increase planarization of the dielectric layer 12, a planarizing layer may be formed on the coating film that is obtained by coating and drying the dielectric paste. A material for forming the planarizing layer may include, for example, a known resin, such as a polyimide resin, a polysiloxane resin, an acryl resin, an epoxy resin, or the like. A film thickness of the planarizing layer may be, for example, smaller than that of the dielectric layer 12 in terms of the dielectric characteristics.

The dielectric layer 12 may be pattern or may not be patterned. Considering the reduction or prevention of erroneous reading due to reduction of crosstalk between dielectric diodes, the dielectric layer 12 may be pattern. A method of patterning may include, for example, in terms of a fine processing, the organic substance may be a photosensitive organic substance to be subjected to photolithography. By performing photolithography, the dielectric diodes may be highly integrated.

The first electrode 11 and the second electrode 13 may each independently include, for example, strontium-ruthenium oxide ($SrRuO_3$), iridium-ruthenium oxide ($SrIrO_3$), calcium-ruthenium oxide ($CaRuO_3$), calcium-nickel oxide ($CaNiO_3$), barium-ruthenium oxide ($BaRuO_3$), barium-strontium-ruthenium oxide ($(Ba,Sr)RuO_3$), iridium (Ir), iridium-ruthenium alloy (IrRu), iridium oxide ($IrO_2$), titanium-aluminum nitride (TiAlN), titanium oxide ($TiO_2$), ruthenium (Ru), platinum (Pt), zirconium oxide ($ZrO_2$), tin oxide ($SnO_2$), indium-tin oxide (ITO), or the like, but embodiments of the present disclosure are not limited thereto. Any material available as a material for forming an electrode may be used, and such a material may be used alone or in combination with each other.

In one embodiment, the first electrode 11 and the second electrode 13 may each be formed by depositing metal, metal oxide, metal nitride, a metal nitrogen oxide, or an alloy according to an electron-beam deposition process, a chemical vapor deposition process, a sputtering process, an atomic layer deposition process, a pulsed laser deposition process, or the like. The first electrode 11 and the second electrode 13 may each be a single-layered structure or a multi-layered structure.

In one or more embodiments, the first electrode 11 and the second electrode 13 may be formed by performing thermal treatment on a coating film that is obtained by coating and drying an electrode paste including a conductive material.

Here, a coating process does not involve a vacuum process or a high-temperature process, and in this regard, the first electrode 11 and the second electrode 13 may each be prepared in a simple manner.

The electrode paste may include particles of a conductive material, an organic substance, and/or a solvent.

For use as the conductive material, any material available for forming a typical electrode may be used. The conductive material may include, for example, a conductive metal oxide, such as tin oxide, indium oxide, indium-tin oxide (ITO), or the like; metal, such as platinum, gold, silver copper, iron, tin, zinc, aluminum, chromium, lithium, sodium, potassium, cesium, calcium, magnesium, palladium, molybdenum, amorphous silicon, or polysilicon, or an alloy thereof; an inorganic conductive material, such as copper iodide, sulfur iodide, or the like; a complex, such as polythiophene, polypyrrole, polyaniline, polyethylene dioxythiophene, polystyrene sulfonic acid, or the like; iodine or the like; a conductive polymer or the like having improved conductivity by doping or the like; or a carbon material. Such a material may be used alone, but a plurality of materials may be stacked or mixed for usage.

The conductive material may be, for example, a metal particle. When the metal particle is used, the capacitor may have improved bending resistance or the electrostatic field does not increase when a voltage is repeatedly applied. Accordingly, irregularities are formed on a surface of a conductive film, and due to an anchoring effect generated by depositing the dielectric layer 12 over the irregularities, the dielectric layer 12 may be tightly adhered to the first electrode 11 and the second electrode 13. The metal particle may include, for example, at least one selected particle of gold, silver, copper, platinum, lead, tin, nickel, aluminum, tungsten, molybdenum, ruthenium oxide, chromium, titanium, carbon, or indium.

The organic substance and the solvent may be the same as the material for forming the dielectric layer 12.

According to another aspect of the present disclosure, a semiconductor device includes the dielectric. The inclusion of the dielectric in the semiconductor device may result in improved properties.

The semiconductor device may be, for example, a memory device.

Figure 5:
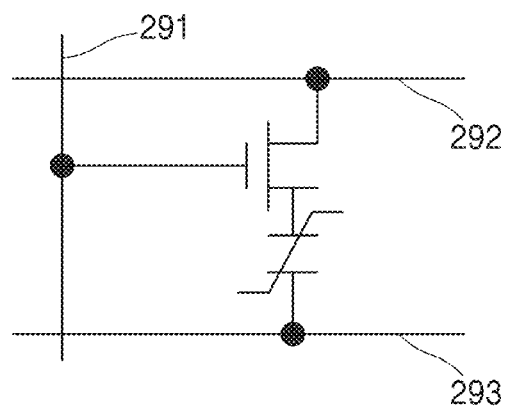
FIG. 5 is a schematic diagram of a basic circuit constituting a memory cell according to an embodiment.

FIG. 5 and FIGS. 6A to 6C are a diagram showing an example structure of a circuit in a 1T1C-type memory cell. Referring to FIG. 5, a gate electrode 24 and a drain electrode 28 of a thin-film transistor 202 are each electrically connected to a wordline 291 and a bitline 292, respectively. In addition, among a first electrode 21 and a second electrode 23 of a capacitor 201, one of the first and second electrodes 21 and 23, which is not electrically connected to a source electrode 26 of the thin-film transistor 202, may be electrically connected to a plateline 293. In the record operation, a voltage may be applied to the wordline 291 to turn on the thin-film transistor 202, and a voltage may be applied between the bitline 292 and the plateline 293. In the read operation, the bitline 292 may be pre-charged to 0 V, and then, a voltage may be applied to the wordline 291 to turn on the thin-film transistor 202, and a predetermined (or alternatively, desired) voltage may be continuously applied to the plateline 293. The bitline 292 is coupled to a sense amplifier, so as to detect a voltage change in the bitline 292 upon the application of voltage to the plateline 293. Accordingly, information "1" or "0" written in a memory cell may be identified.

Figure 6A:
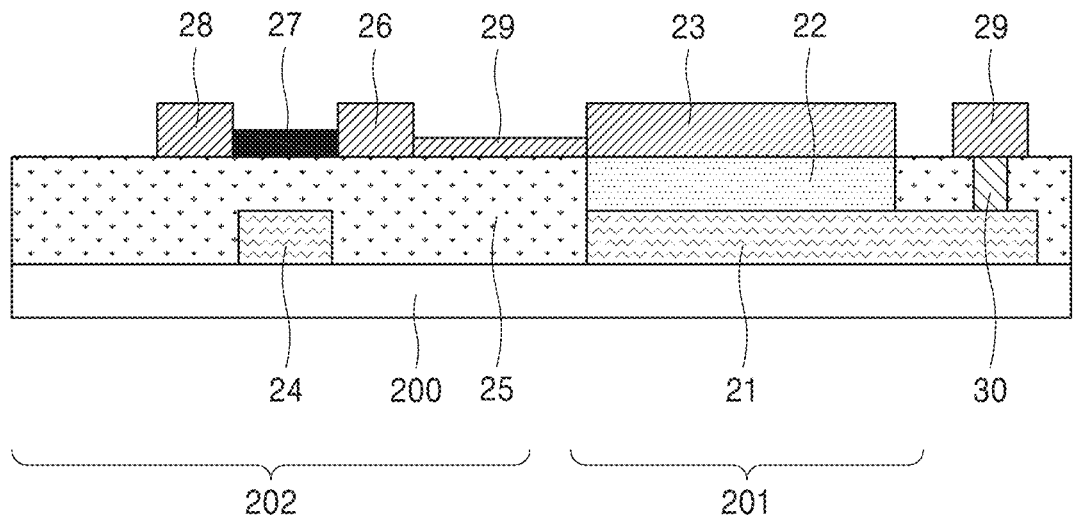
FIGS. 6A and 6B are each a schematic diagram of a memory cell according to an embodiment.
Figure 6B:
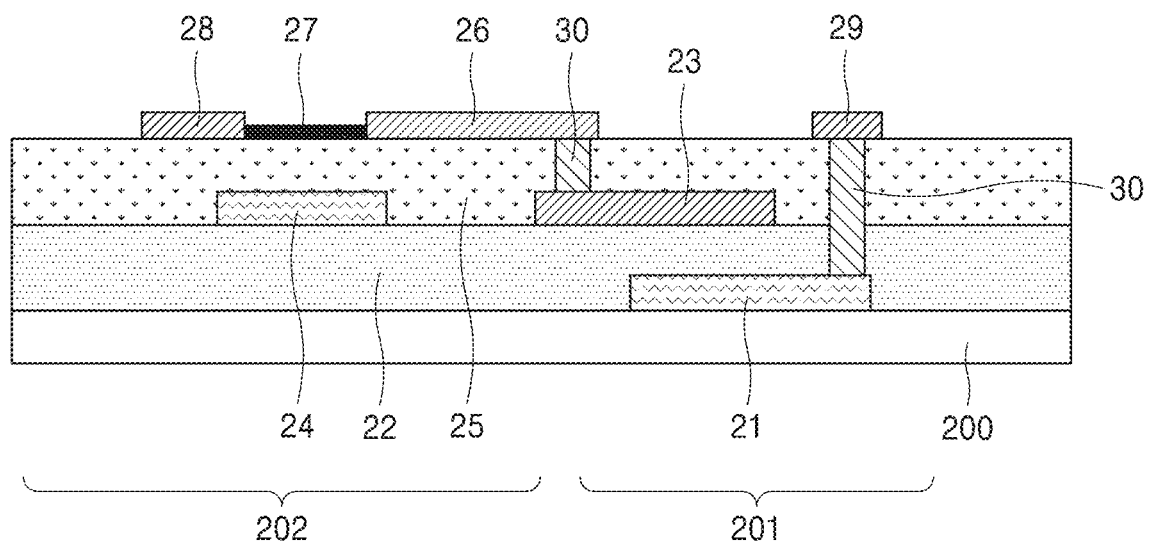

FIGS. 6A and 6B are each a diagram showing an example structure of a memory cell (so-called a 1T1C-type) including a capacitor 201 and a thin-film transistor 202 which controls the reading and writing of the capacitor 201. As the thin-film transistor 202 performs ON/OFF switching of the current, the writing and reading of information into the capacitor may be accordingly performed. The capacitor 201 may be applicable to a 2-transistor/2-capacitor memory cell (so-called a 2T2C-type) in which two 1T1C-type memory cells are combined. Here, the structure of the 1T1C-type memory cell may be not limited to the embodiments of the present disclosure.

Referring to FIGS. 6A and 6B, a memory cell includes an insulating substrate 200, a capacitor 201, which includes a first electrode 21, a second electrode 23, and/or a dielectric layer 22, on the insulating substrate 200, a thin-film transistor 202, which includes a gate electrode 24, a gate insulating layer 25, a source electrode 26, a drain electrode 28, and/or a semiconductor layer 27, a wire 29, and via 30. In addition, FIGS. 6A and 6B each show an example structure of the memory cell in which the source electrode 26 and an upper electrode 23 are in electrical contact with one another, but the memory cell may also have a structure in which the source electrode 26 and a lower electrode 21 are in electrical contact with one another. In addition, FIGS. 6A and 6B each illustrate the thin-film transistor 202 having a bottom-to-gate structure, but the thin-film transistor may also have a top-to-gate structure may be also used.

According to another aspect of the present disclosure, a method of preparing the dielectric includes: mixing an alkali metal or an alkaline earth metal with a transition metal precursor to prepare a mixture; performing a first thermal process on the mixture in the air atmosphere at a temperature in a range of 1,000° C. to 1,400° C. for 1 hour to 20 hours to prepare a first sintered material; molding and pressurizing the first sintered material to prepare a molded article; and performing a second thermal process on the molded article at a temperature of 1,400° C. or higher for 1 hour to 20 hours to prepare a second sintered material. The dielectric obtained according to the method may have an improved dielectric constant and a reduced dielectric loss.

Examples of the alkali metal precursor or the alkaline metal precursor are $Na_2CO_3$, $K_2CO_3$, $CaCO_3$, $SrCO_3$, and the like, but are not limited thereto. Any material available as the alkali metal precursor or the alkaline metal precursor in the art may be used.

Examples of the transition metal precursor are $Ta_2O_5$, $Nb_2O_5$, $V_2O_5$, $TiO_2$, and the like, but are not limited thereto. Any material available as the transition metal precursor in the art may be used.

The mixing may be ball milling, planetary ball milling, high energy ball milling, or the like, but is not limited thereto. Any mixing method used in the art may be used. Here, the time for which the mixing is performed may be, for example, for about 1 hour to about 100 hours.

The first thermal process may be performed, for example, at a temperature in a range of about 1,000° C. to about 1,400° C., about 1,050° C. to about 1,350° C., about 1,100° C. to about 1,300° C., or about 1,150° C. to about 1,250° C. The first thermal process may be performed, for example, for about 1 hour to about 20 hours, about 4 hours to about 18 hours, about 8 hours to about 16 hours, or about 10 hours to about 14 hours. When the first thermal process is performed under the conditions described above, an oxide having a single crystal with a perovskite type crystal structure belonging to a polar space group may be obtained. Here, the first thermal process may be performed in the air or oxygen atmosphere.

The molding and the pressurizing are not particularly limited, and any molding and pressurizing methods used in the art may be used. The pressurizing may be isostatic pressurizing, flat pressurizing, roll pressurizing, or the like. The pressure to be applied in the pressurizing may be in a range of about 100 MPa to about 500 MPa, about 150 MPa to about 450 MPa, about 200 MPa to about 400 MPa, about 200 MPa to about 350 MPa, or about 200 MPa to about 300 MPa, and the time for which pressurizing is performed may be for about 1 minute to about 30 minutes, about 1 minute to about 20 minutes, about 1 minute to about 10 minutes, or about 1 minute to about 5 minutes.

The second thermal process may be performed at a temperature of 1,400° C. or higher. When the temperature at which the second thermal process is performed is too low, the relative density of the second sintered material is lowered, resulting in a low dielectric constant of the dielectric. In this regard, the second thermal process may be performed at a temperature in a range of about 1,400° C. to about 2,000° C., about 1,400° C. to about 1,900° C., about 1,400° C. to about 1,800° C., about 1,400° C. to about 1,700° C., or about 1,400° C. to about 1,600° C. The second thermal process may be performed, for example, for about 1 hour to about 20 hours, about 1.5 hours to about 18 hours, about 2 hours to about 16 hours, about 2.5 hours to about 12 hours, or about 3 hours to about 10 hours. When the second thermal process is performed under the conditions described above, the second sintered material obtained therefrom may have a further improved dielectric constant. Here, the second thermal process may be performed in the air or oxygen atmosphere.

Hereinafter, embodiments are described in detail by referring to the attached drawings, and in the drawings, like reference numerals denote like elements, and a redundant explanation thereof will not be provided herein.

(Preparation of Dielectric)

Example 1

$NaTaO_3$, 1,400° C., 4 Hours $Na_2CO_3$ and $Ta_2O_5$ were mixed at a molar ratio of Na:Ta=1.05:1, and ethanol and zirconia balls were added thereto. A ball milling process was performed thereon for 24 hours at room temperature in the air, so as to prepare a mixture. Then, the prepared mixture was dried to obtain dried powder.

The dried powder was placed in an alumina crucible, and a first thermal process was performed thereon for 12 hours at a temperature of 1,200° C. in the air, so as to obtain a first sintered material. The first sintered material was then pulverized to prepare fine powder.

The fine powder was molded into a pellet form, and then, pressed for 3 minutes under a cold isotactic pressure of 250 MPa, so as to prepare a press-molded product.

A second thermal process was performed on the prepared press-molded product for 4 hours at a temperature of 1,400° C. in the air to prepare a dielectric as a second sintered product. The prepared dielectric had a composition of $NaTaO_3$.

Example 2

$NaTaO_3$, 1,500° C., 4 Hours

A dielectric having a composition of $NaTaO_3$ was prepared in the same manner as in Example 1, except that the temperature at which the second thermal process was performed was changed to 1,500° C.

Example 3

$NaTaO_3$, 1,600° C., 4 Hours

A dielectric having a composition of $NaTaO_3$ was prepared in the same manner as in Example 1, except that the temperature at which the second thermal process was performed was changed to 1,600° C.

Example 4

$NaTaO_3$, 1,600° C., 12 Hours

A dielectric having a composition of $NaTaO_3$ was prepared in the same manner as in Example 1, except that the second thermal process was performed at a temperature of 1,600° C. for 12 hours.

Evaluation Example 1

Identification of Crystal Structure

Figure 1B:
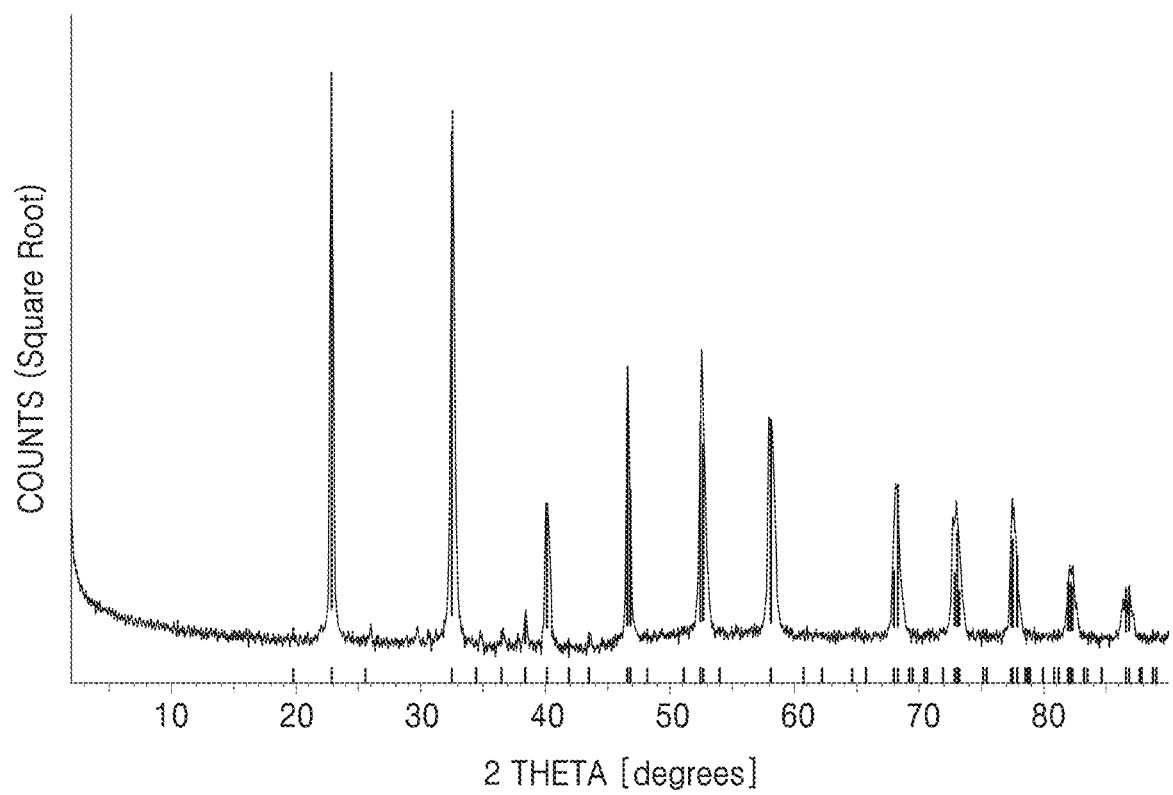
FIG. 1B shows an XRD spectrum of a dielectric prepared by performing a second thermal process thereon according to Example 1.
Figure 2A:
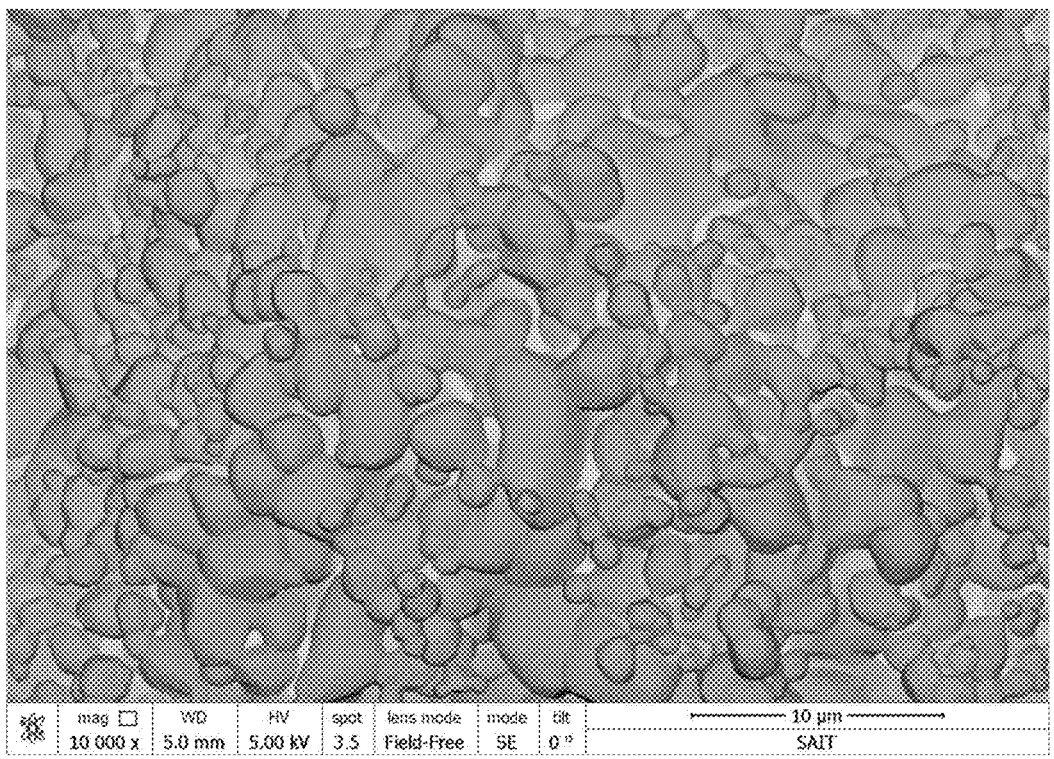
FIG. 2A is a scanning electron microscope (SEM) image of a surface of a dielectric prepared according to Example 1.
Figure 2B:
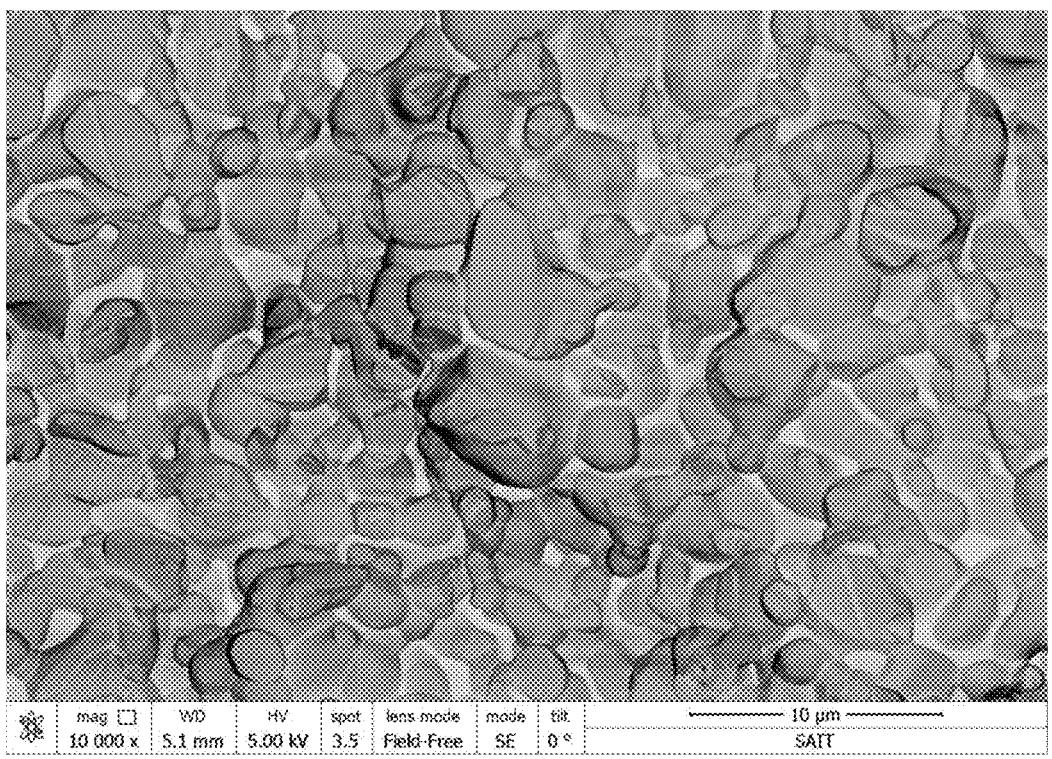
FIG. 2B is an SEM image of a surface of a dielectric prepared according to Example 2.
Figure 2C:
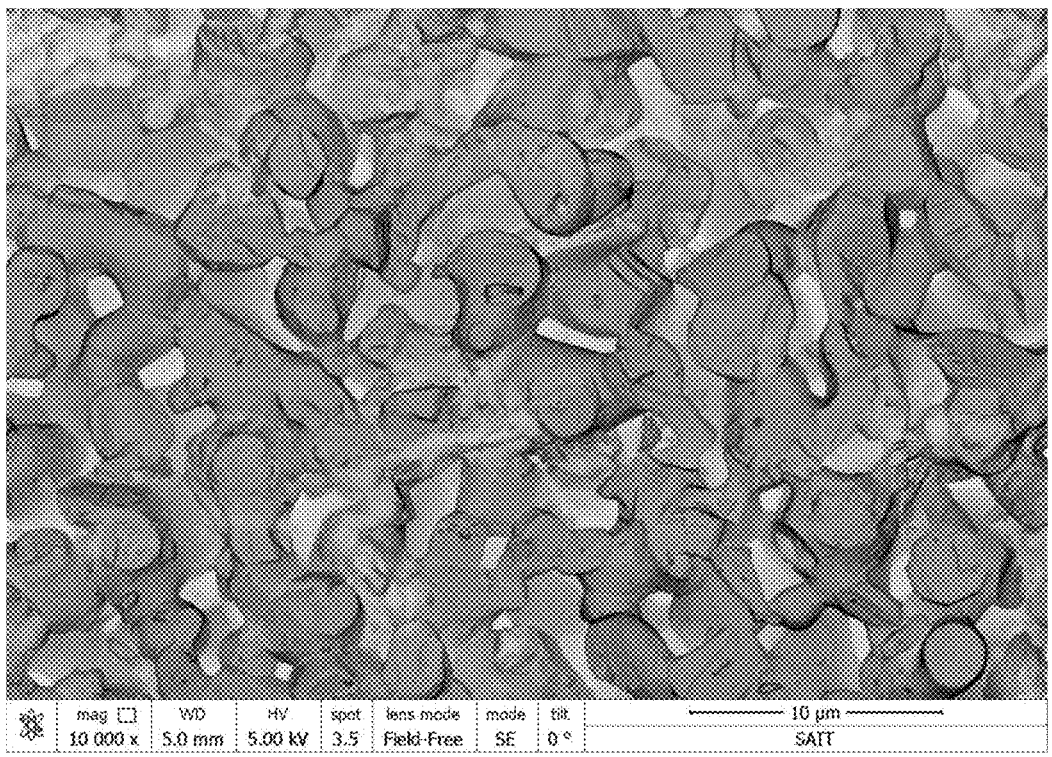
FIG. 2C is an SEM image of a surface of a dielectric prepared according to Example 3.
Figure 2D:
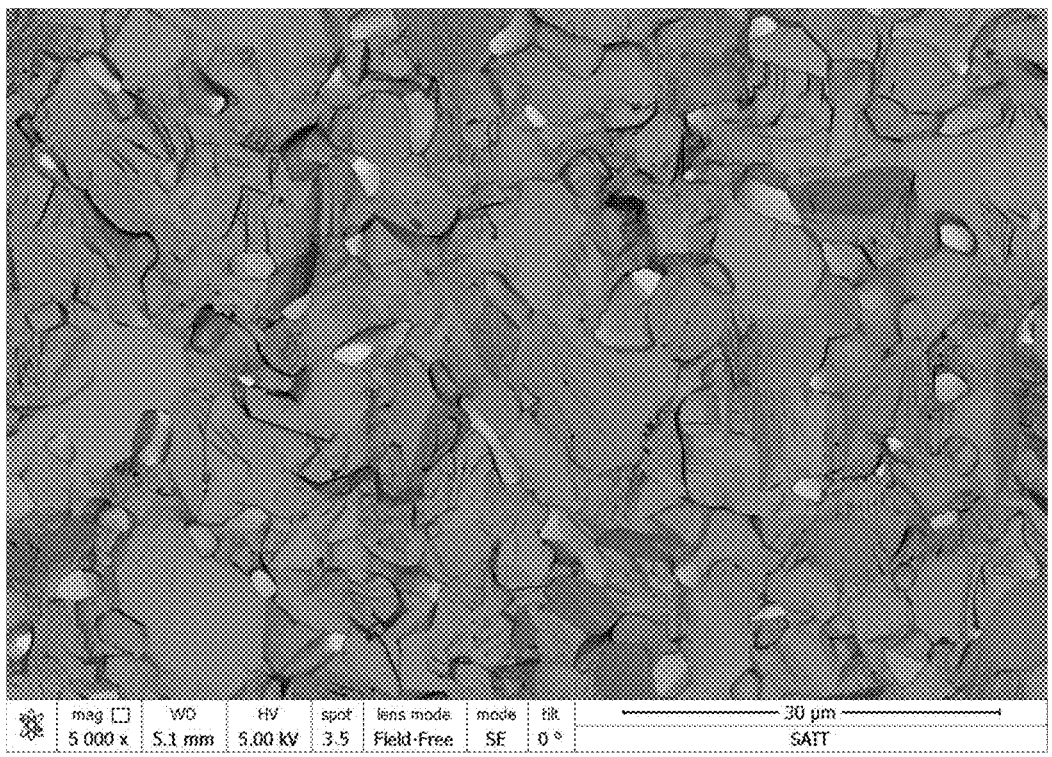
FIG. 2D is an SEM image of a surface of a dielectric prepared according to Example 4.

First and second sintered products obtained according to Example 3 were subjected to X-ray diffraction (XRD) measurement, and the measurement results are shown in FIGS. 1A and 1B. Here, Cu-Kα radiation was used for the XRD spectral measurements.

As shown in FIGS. 1A and 1B, it was confirmed that the first and second sintered products each had a $NaTaO_3$ single phase with a perovskite crystal structure.

In addition, through the crystal structure analysis, it was confirmed that the dielectrics having the composition of NaTaO$_3$ prepared according to Examples 1 to 4 each had a Pc2$_1$n space group belonging to a polar space group.

Evaluation Example 2

Identification of Dielectric Morphology

SEM images were measured with respect to the surface of each of the dielectrics prepared according to Examples 1 to 4, and the results are shown in FIGS. 2A to 2D.

As shown in FIGS. 2A to 2D, the morphology of the dielectric was an agglomerate including a plurality of primary particles. Here, the primary particles, e.g., crystallites, included in the dielectric had an average particle diameter of about 5 um.

As shown in FIGS. 2A to 2D, the agglomerate including the plurality of the primary particles may be a porous agglomerate including pores disposed between the primary particles.

The average particle diameter of the primary particles was an arithmetic mean value obtained by separately measuring diameters of the primary particles shown in the SEM images. Here, as a diameter of the primary particles, the maximum value of the distance between the both ends of the primary particles was used.

Evaluation Example 3

Evaluation of Relative Density

Regarding the dielectrics prepared according to Examples 1 to 4, the relative density was measured by using the buoyancy method (e.g., Archimedes method).

The measurement results are shown in Table 1.

Evaluation Example 4

Evaluation of Dielectric Constant and Dielectric Loss

The dielectric pellets prepared according to Examples 1 to 4 were coated with In—Ga on both sides to form an electrode, and a dielectric constant and a dielectric loss thereof were measured at room temperature by using an E4980A Precision LCR Meter (Keysight) within a frequency range of 1 kHz to 1 MHz.

The dielectric constant and the dielectric loss measured at a frequency of 1 MHz were referred to as tan δ, and the measurement results are shown in Table 1.

Comparative Example 1 provided dielectric data with respect to the dielectric having a composition of NaTaO$_3$ with a crystal structure belonging to a pbnm space group which is a non-polar space group, at a frequency of 1 MHz (Solid State Sciences, 11, 2009, 562-569).

TABLE 1

|  | Dielectric constant | Dielectric loss | Relative density [%] |
|---|---|---|---|
| Example 1 | 63 | 0.105 | 68.0 |
| Example 2 | 73 | 0.074 | 78.3 |
| Example 3 | 93 | 0.040 | 84.0 |
| Example 4 | 142 | 0.006 | 96.4 |
| Comparative Example 1 | ~38 | — | — |

As shown in Table 1, the dielectrics of Examples 1 to 4 each having the composition of NaTaO$_3$ with the crystal structure belonging to the Pc2$_1$n space group had a high dielectric constant of at least 50, whereas the dielectric of Comparative Example 1 having the composition of NaTaO$_3$ with the crystal structure belonging to the bnm space group had a dielectric constant of less than 40.

Therefore, it was confirmed that when the composition of NaTaO$_3$ had the crystal structure belonging to the Pc2$_1$n space group, the dielectric constant was significantly increased.

It addition, it was confirmed that the dielectrics of Examples 1 to 4 each having the composition of NaTaO$_3$ had a low dielectric loss while having a high relative density of at least 60%.

Evaluation Example 5

Evaluation of Band Gap

Figure 3:
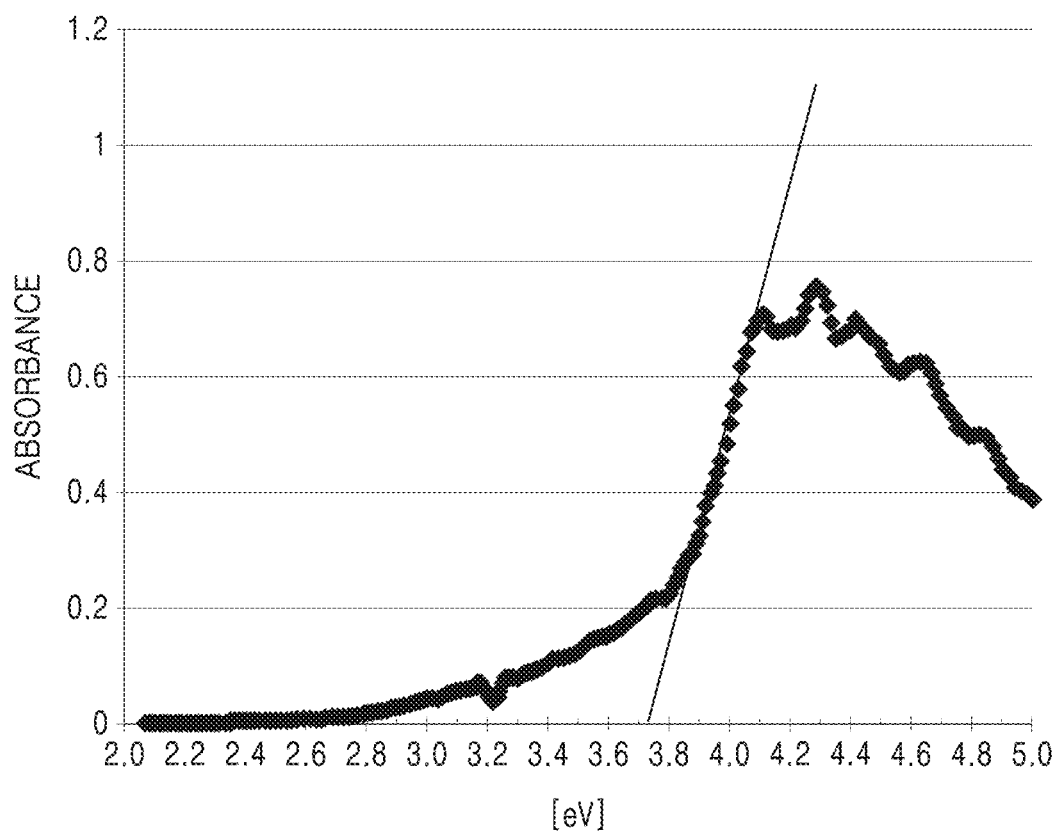
FIG. 3 is a graph showing a ultraviolet (UV)-Vis. absorption spectrum of a dielectric prepared according to Example 4.

The dielectric of Example 4 was subjected to the measurement of an UV-Vis absorption spectrum under according to the equation $\alpha h\nu = A(h\nu - Eg)^{1/2}$, and the measurement results were converted into a $(\alpha h\nu)^2$ vs. hv graph as shown in FIG. 3. From the graph of FIG. 3 where the UV-Vis. absorption spectrum measurements were converted, a band gap was obtained by extrapolating the slope in the graph. In the conversion equation, A indicates absorbance, α indicates an absorption coefficient, hv indicates a photon energy, and Eg indicates a band gap.

The dielectric of Example 4 having the composition of NaTaO$_3$ had a band gap of about 3.8 eV. That is, considering that the dielectric having the composition of NaTaO$_3$ had a band gap of at least 3.0 eV, the dielectric was suitable for use in a dielectric layer, such as a capacitor.

Evaluation Example 6

Property Calculation (I)

Regarding the ABO$_3$ (A=Li, K, Na, Cs, Rb, B=V, Nb, Ta) oxides each having the crystal structure belonging to the Pc21n space group, a dielectric constant and a band gap were calculated, and some of the calculation results are shown in Table 2.

The dielectric constant and the band gap were calculated using the Vienna Ab initio Simulation Package (VASP) in the framework of density functional theory (DFT).

TABLE 2

| Composition of dielectric | Dielectric constant | Band gap [eV] |
|---|---|---|
| LiTaO$_3$ | 115 | 4.49 |
| KTaO$_3$ | 143 | 3.33 |
| RbTaO$_3$ | 617 | 3.65 |
| NaNbO$_3$ | 2000 | 3.51 |

As shown in Table 2, the oxides having the composition of LiTaO$_3$, KTaO$_3$, or RbTaO$_3$, and NaNbO$_3$ with the perovskite crystal structure belonging to the Pc2$_1$n space group each had a dielectric constant of at least 50 and a band gap of at least 3.0 eV. Accordingly, it was confirmed that these oxides were suitable for use as the dielectric.

Evaluation Example 7

Property Calculation (II)

Regarding oxides each having the composition of NaTaO$_3$ with the crystal structure belonging to various space groups, a dielectric constant and a band gap were calculated, and some of the calculation results are shown in Table 3.

The dielectric constant and the band gap were calculated using the VASP in the framework of DFT.

TABLE 3

| NaTaO$_3$ space group | Dielectric constant | Band gap [eV] |
|---|---|---|
| Cmcm | 126 | 3.68 |

As shown in Table 3, the oxide having the composition of NaTaO$_3$ with the perovskite crystal structure belonging to the Cmcm space group had a dielectric constant of at least 50 and a band gap of at least 3.0 eV. Accordingly, was confirmed that this oxide was suitable for use as the dielectric.

According to the one or more embodiments of the present disclosure, when a dielectric including a perovskite oxide having a new crystal structure is used in a capacitor and a semiconductor device, the capacity of the capacitor and/or the performance of the semiconductor device may be improved.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A dielectric comprising:
   an oxide comprising a composition represented by Formula 1 and comprising a perovskite type crystal structure belonging to a polar space group or a non-polar space group other than a Pbnm space group,
   wherein the oxide is an aggregate of primary particles, and $$A_xB_yO_{3-\delta} \qquad \text{<Formula 1>}$$

wherein, in Formula 1,
   A is a monovalent, divalent, or trivalent cation,
   B is a trivalent, tetravalent, or pentavalent cation, and
   0.5≤x≤1.5, 0.5≤y≤1.5, and 0≤δ≤0.5.

2. The dielectric of claim 1, wherein the oxide has a dielectric constant about 55 or higher at 1 MHz.

3. The dielectric of claim 1, wherein the polar space group comprises a Pc2$_1$n space group, and the non-polar space group comprises a Pcmn, P4/mbm, Pm-3m, or Cmcm space group.

4. The dielectric of claim 1, wherein the oxide comprises a composition represented by Formula 2:

$$A_xB_yO_3 \qquad \text{<Formula 2>}$$

wherein, in Formula 2,
   A is a monovalent cation,
   B is a pentavalent cation, and
   0.9≤x≤1.5 and 0.9≤y≤1.5.

5. The dielectric of claim 1, wherein A comprises at least one selected from an alkali metal element and an alkaline earth metal element.

6. The dielectric of claim 1, wherein A comprises at least one selected from lithium (Li), sodium (Na), potassium (K), rubidium (Rb), and cesium (Cs).

7. The dielectric of claim 1, wherein B is a transition metal element.

8. The dielectric of claim 1, wherein B comprises at least one selected from vanadium (V), niobium (Nb), and tantalum (Ta).

9. The dielectric of claim 1, wherein A comprises at least one selected from Li, Na, K, Rb, and Cs, and B comprises at least one selected from V, Nb, and Ta.

10. The dielectric of claim 1, wherein the oxide comprises at least one selected from Na$_{1-x}$K$_x$TaO$_3$ (0≤x≤1), Na$_{1-x}$Li$_x$TaO$_3$ (0≤x≤1), Na$_{1-x}$K$_x$TaO$_3$ (0≤x≤1), Na$_{1-x}$Rb$_x$TaO$_3$ (0≤x≤1), Na$_{1-x}$Cs$_x$TaO$_3$ (0≤x≤1), Na$_{1-x}$K$_x$VO$_3$ (0≤x≤1), Na$_{1-x}$Li$_x$VO$_3$ (0≤x≤1), Na$_{1-x}$K$_x$VO$_3$ (0≤x≤1), Na$_{1-x}$Rb$_x$VO$_3$ (0≤x≤1), Na$_{1-x}$Cs$_x$VO$_3$ (0≤x≤1), Na$_{1-x}$K$_x$NbO$_3$ (0≤x≤1), Na$_{1-x}$Li$_x$NbO$_3$ (0≤x≤1), Na$_{1-x}$K$_x$NbO$_3$ (0≤x≤1), Na$_{1-x}$Rb$_x$NbO$_3$ (0≤x≤1), Na$_{1-x}$Cs$_x$NbO$_3$ (0≤x≤1), K$_{1-x}$Li$_x$TaO$_3$ (0≤x≤1), K$_{1-x}$Rb$_x$TaO$_3$ (0≤x≤1), K$_{1-x}$Cs$_x$TaO$_3$ (0≤x≤1), K$_{1-x}$Li$_x$VO$_3$ (0≤x≤1), K$_{1-x}$Rb$_x$VO$_3$ (0≤x≤1), Na$_{1-x}$Cs$_x$VO$_3$ (0≤x≤1), K$_{1-x}$Li$_x$NbO$_3$ (0≤x≤1), K$_{1-x}$Rb$_x$NbO$_3$ (0≤x≤1), and K$_{1-x}$Cs$_x$NbO$_3$ (0≤x≤1).

11. The dielectric of claim 1, wherein the oxide comprises at least one selected from NaTaO$_3$, LiTaO$_3$, KTaO$_3$, RbTaO$_3$, CsTaO$_3$, NaVO$_3$, and NaNbO$_3$.

12. The dielectric of claim 1, wherein the primary particles have an average particle diameter in a range of 1 um to 10 um.

13. The dielectric of claim 1, wherein the oxide is porous.

14. The dielectric of claim 1, wherein the dielectric has relative density of 60% more when measured according to a buoyancy method of the oxide.

15. The dielectric of claim 1, wherein the oxide has a dielectric loss, tan δ, of 0.11 or less.

16. The dielectric of claim 1, wherein the oxide has a band gap of 3 eV or more.

17. A capacitor comprising:
   a first electrode;
   a second electrode; and
   a dielectric between the first electrode and the second electrode,
   wherein the dielectric comprises an oxide comprising a composition represented by Formula 1 and comprises a perovskite type crystal structure belonging to a polar space group or a non-polar space group other than a Pbnm space group,
   wherein the oxide is an aggregate of primary particles, and $$A_xB_yO_{3-\delta} \qquad \text{<Formula 1>}$$

wherein, in Formula 1,
   A is a monovalent, divalent, or trivalent cation,
   B is a trivalent, tetravalent, or pentavalent cation, and
   0.5≤x≤1.5, 0.5≤y≤1.5, and 0≤δ≤0.5.

18. A semiconductor device comprising:
   a dielectric,
   wherein the dielectric comprises an oxide comprising a composition represented by Formula 1 and comprises a perovskite type crystal structure belonging to a polar space group or a non-polar space group other than a Pbnm space group, wherein the oxide is an aggregate of primary particles, and $$A_xB_yO_{3-\delta} \qquad \text{<Formula 1>}$$

wherein, in Formula 1,
A is a monovalent, divalent, or trivalent cation,
B is a trivalent, tetravalent, or pentavalent cation, and
$0.5 \leq x \leq 1.5$, $0.5 \leq y \leq 1.5$, and $0 \leq \delta \leq 0.5$.

19. A method of preparing a dielectric, the method comprising:
mixing an alkali metal or an alkaline earth metal with a transition metal precursor to prepare a mixture;
performing a first thermal process on the mixture in an air atmosphere at a temperature in a range of 1,000° C. to 1,400° C. for 1 hour to 20 hours to prepare a first sintered material;
molding and pressurizing the first sintered material to prepare a molded article; and
performing a second thermal process on the molded article at a temperature of 1,400° C. or higher for 1 hour to 20 hours to prepare a second sintered material,
wherein the dielectric comprises an oxide comprising a composition represented by Formula 1 and comprises a perovskite type crystal structure belonging to a polar space group or a non-polar space group other than a Pbnm space group,
wherein the oxide is an aggregate of primary particles, and $$A_xB_yO_{3-\delta} \qquad \text{<Formula 1>}$$

wherein, in Formula 1,
A is a monovalent, divalent, or trivalent cation,
B is a trivalent, tetravalent, or pentavalent cation, and
$0.5 \leq x \leq 1.5$, $0.5 \leq y \leq 1.5$, and $0 \leq \delta \leq 0.5$.

* * * * *